United States Patent [19]
Chana et al.

[11] 3,959,724
[45] May 25, 1976

[54] ELECTRONIC WATTMETER

[75] Inventors: Maghar S. Chana; Ramond L. Kraley, both of Rochester; Eric A. Hauptmann, Fairport; Barry M. Pressman, Penfield, all of N.Y.

[73] Assignee: Rochester Instrument Systems, Inc., Rochester, N.Y.

[22] Filed: July 22, 1974

[21] Appl. No.: 490,787

[52] U.S. Cl.............................. 324/142; 324/140 R; 307/265; 328/160; 235/194
[51] Int. Cl.² .................... G01R 7/00; G01R 11/32; G06G 7/161; H03K 1/18
[58] Field of Search ............ 324/140, 142; 307/265; 328/160; 235/194

[56] References Cited
UNITED STATES PATENTS

| | | | |
|---|---|---|---|
| 3,760,273 | 9/1973 | Burkett et al. | 324/142 |
| 3,780,273 | 12/1973 | Turrell | 324/142 |

*Primary Examiner*—Saxfield Chatmon, Jr.
*Attorney, Agent, or Firm*—Eliot S. Gerber

[57] ABSTRACT

An electronic wattmeter (transducer) to measure the average power to a load or on an electric power line includes a current transformer, a voltage transformer and a power transformer, the primary coil of each transformer being connected to the power line. The secondary coil of the current transformer is connected to a modulator so that changes in current vary the duty cycle, i.e., zero crossings, of a duty cycle modulator-oscillator. The modulator and the secondary of the voltage transformer are connected to an electronic switch whose switchings are controlled by the zero crossings of the oscillator's pulses whose output is a pulse train in which the pulses vary in width dependent upon current and vary in amplitude dependent upon voltage. The switch is connected to a filter whose output is a d.c. voltage which is proportional to the average electric power on the line.

13 Claims, 9 Drawing Figures

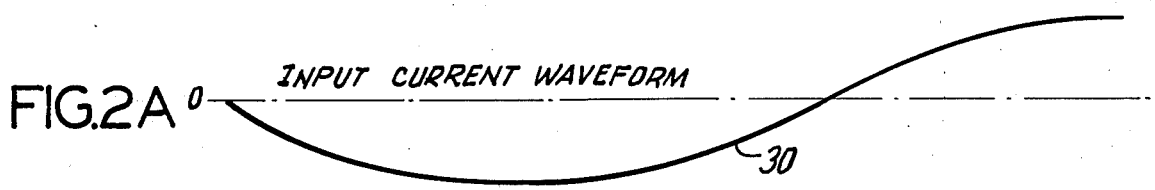
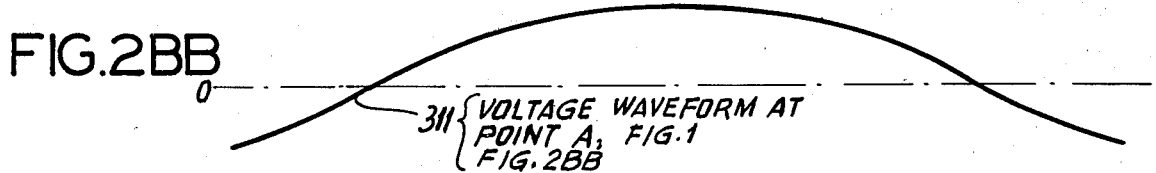
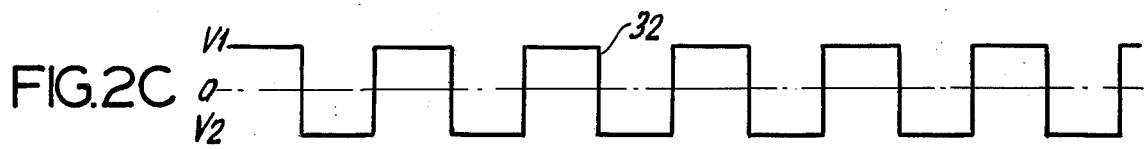
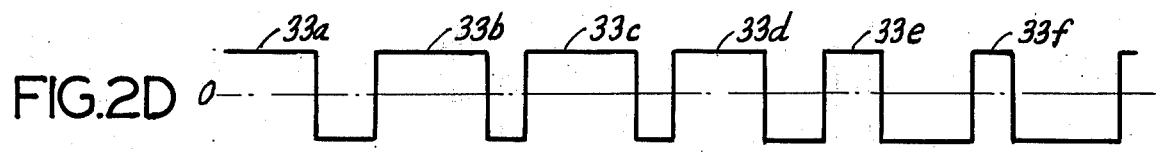
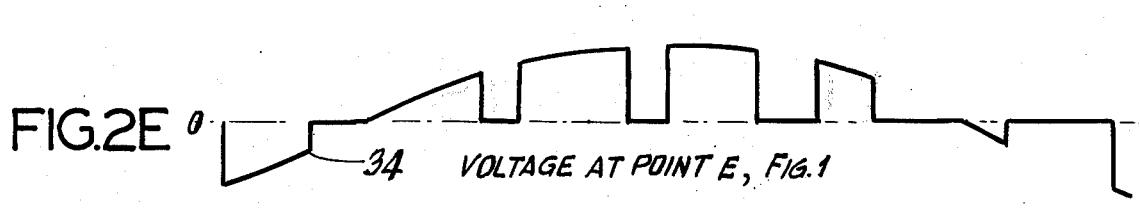
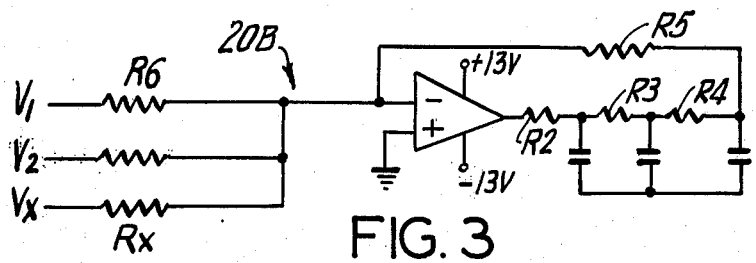

ELECTRONIC WATTMETER

FIELD OF THE INVENTION

The field of the invention is a transducer which produces an output proportional to the product of two input waveforms and their relative phase, which waveforms vary in amplitude and have a common frequency. More particularly, the present invention relates to an electronic wattmeter and varmeter which measures real and reactive power on a line or to a load.

BACKGROUND OF THE INVENTION

For many years alternating current (a.c.) power was measured by wattmeters of the dynamometer type. Such meters employed electromagnetic coils which moved a needle or disk to indicate the average power. It was found, however, that such instruments were not entirely accurate, were slow in response and did not provide a direct current output useful in recording and testing instruments.

In recent years there have been many proposals for watt transducers and wattmeters of the electronic type. Some of these electronic watt transducers utilize Hall Effect devices, which may be relatively costly and inaccurate and require elaborate temperature compensation. Other such proposals for electronic watt transducers are based upon statistical coincidence methods and employ complex circuitry, such as those of U.S. Pats. Nos. 3,510,772 and 3,525,042. Other electronic wattmeter instruments, such as those of U.S. Pats. Nos. 2,879,477 and 3,662,264, utilize circuitry to, in effect, compute the square law to determine the average power.

The present invention, however, utilizes a type of electronic watt transducer in which one waveform provides the control to a switch which is connected to transmit the other waveform. This general type of wattmeter is described in U.S. Pats. Nos. 3,794,917 and 3,500,200. In U.S. Pat. No. 3,500,200 a triangular waveform is modulated by the current input to have a variable width, then modulated by the voltage input as to amplitude, and the pulses integrated to produce a d.c. output representative of the a.c. average power consumed. In U.S. Pat. No. 3,794,917 the voltage input and a precision triangular waveform are coupled to a comparator which controls electronic switches, so that the duty ratio of the output of the comparator is proportional to the voltage amplitude. However, the circuitry of these two patents is relatively complex and costly. The complexity of their circuitry makes it difficult to guard against the adverse effects of aging and temperature variations, and consequently may lead to inaccuracy of measurement.

Wattmeters measure the average electric power when the current and voltage have common frequency, although they may have a phase difference between them. The average power $W$ to be representative of true power consumed must take into account the voltage, the current and the difference between their wave peaks (phase displacement $\theta$) which phase displacement is the "power factor" represented by $\cos \theta$. The average power $W$ at a given frequency is the product of the rms values of voltage $V$, current $I$ and the cosine of phase difference $\theta$, i.e., $W = VI \cos \theta$. In general, the average power $W$, over an interval $T$, is equal to the integral $$W = \frac{1}{T} \int_0^T ei\, dt,$$

where $e$ and $i$ are the instantaneous values of voltage and current. The wattmeter of the present invention produces an output signal which closely approximates that integral equal to $W$. A pulse train is modulated so that the duty cycle of the pulses are proportional to $I$ and the amplitude of the pulses are proportional to $V$. When this signal is filtered, the d.c. voltage resulting closely approximates $W$.

SUMMARY OF THE INVENTION

In accordance with the present invention a watt transducer is provided to monitor the power on a power line. The watt transducer has the primary coils of its current transformer, voltage transformer and power transformer connected to the power line. The secondary of the current transformer is connected to a duty cycle modulated oscillator whose a.c. gain is attempted to be kept constant but whose d.c. gain, i.e., the width of the pulses and their frequency, may vary slowly. The zero crossings of the pulse train (the duty cycle) are determined by the amplitude of the current waveform. The oscillator is an operational amplifier having a negative feedback path having a resistor-capacitor network or alternative type of phase shifting network and two reference Zener diodes (temperature compensated Zener diode) to provide for clipping of the pulses to thereby avoid adverse effects from supply voltage and temperature variations. The secondary of the voltage transformer is connected to the emitter of a transistor, which acts as an electronic switch. The base of that transistor, which is the switch control, is connected to the output of the modulator so that the oscillator pulse's zero crossings change the state of the transistor.

The resulting pulse train has its amplitude of each pulse determined by the voltage amplitude and its duty cycle determined by the current amplitude. That pulse train is fed to a filter, which is a resistor-capacitor network, which reacts to the total energy of the pulse train and produces a direct current output proportional to the average a.c. power on the power line. An amplifier, which is an operational amplifier, amplifies the d.c. from the filter for use in recording or other measurement uses.

It is an objective of the present invention to provide a watt transducer which measures power accurately, regardless of input level, over a broad range of amperage or voltage.

It is an objective of the present invention to provide a watt transducer which is accurate in usage despite ambient temperature changes and is accurate over a relatively long service lifetime.

It is a further objective of the present invention to provide a watt transducer which is an electronic watt transducer utilizing relatively simple circuitry employing reliable solid state active elements.

Other objectives and features of the present invention will be apparent from the following detailed description of the inventor's best mode of practicing the invention.

BRIEF DESCRIPTION OF THE DRAWINGS

In the accompanying drawings:

FIGS. 2A, 2AA, 2B, 2BB, 2C, 2D and 2E are wave form diagrams taken at various points in the circuit illustrated in FIG. 1; and FIG. 3 is a schematic diagram of an alternative circuit for a portion of the circuitry of FIG. 1.

DETAILED DESCRIPTION OF THE INVENTION

Figure 1:
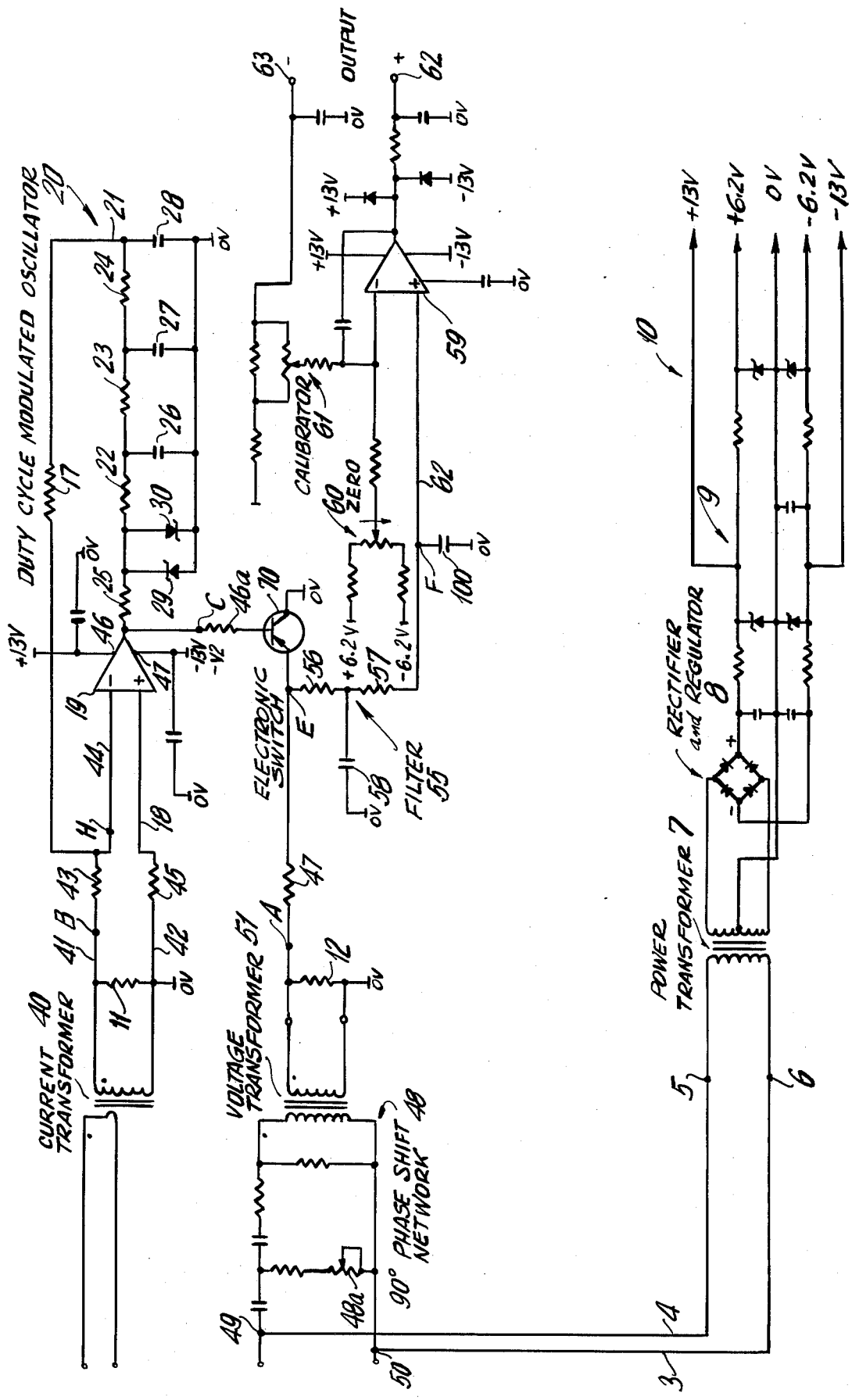
FIG. 1 is a schematic diagram of an embodiment of the circuitry of the present invention as applied to a watt transducer which monitors average reactive power (vars) on a power line.

The present invention, as described in connection with the accompanying FIGS. 1 and 2, is described in connection with a wattmeter which monitors average reactive power (vars). However, it will be understood that the scope of the invention is to be determined in view of the subjoined claims. At the conclusion of the description of FIGS. 1 and 2, an explanation of some further uses of the instrument of the present invention is provided. The instrument of the present invention, in its general form, is a transducer which multiplies two input wave forms and provides a direct current output proportional to the average of the multiplied waveforms. It is this generalized use of this type of multiplier to which the present invention is related, although the detailed description of the preferred embodiment is in connection with a specific wattmeter.

As shown in FIG. 1, the wattmeter of the present invention utilizes power which is obtained from the power lines 3 and 4 respectively. The points 5 and 6 are connected to the primary coil of a power transformer 7. The secondary coil of that power transformer 7, at its end points and at its tapped center point, is connected to a full-wave current bridge 8 utilizing four diodes in a back-to-back relationship. The diodes provide rectified direct current which is regulated by a capacitor and Zener diode network 9 utilizing four Zener diodes. The outputs of this power supply 10 are at the voltages required to power the wattmeter; for example, in connection with the embodiment shown in FIG. 1, the output voltages are at +13 volts, +6.2 volts, and negative 6.2 volts and negative 13 volts. Those voltages are connected to the respective voltage lines as shown at the top of the figure; for example, where the figure has a place labeled "+13V" it means that the line is connected to the line in the power supply 10 labeled +13V.

The current input to the wattmeter is to two coils which form the primary of the current transformer 40. The secondary coil of the current transformer 40 has a resistor 11 between its output lines 41 and 42. Its line 41 is connected through resistor 43 to the negative input 44 of an operational amplifier 19. The opposite line 42 at zero ground potential is connected through resistor 45 to the positive input 18 of the operational amplifier 19. The operational amplifier receives power from the power supply +13 volts and negative 13 volts through its terminals, respectively 46 and 47.

The output of the operational amplifier is to resistor 25 which is connected to a network in the negative feedback path of the operational amplifier 19. The network comprises reference Zener diodes 29 and 30 (temperature compensated) resistors 22, 23 and 24, and capacitors 26, 27 and 28. The line 21 in the negative feedback path is connected through resistor 17 to the negative input 44 of the operational amplifier 19.

The operational amplifier 19, together with its negative feedback path network, constitutes a duty cycle modulated oscillator 20 which produces an output pulse train shown in FIG. 2C. The frequency of the pulse train is drawn at a reduced rate for clarity. Each of the pulses 32 of the pulse train are of constant short-term width in the absence of an input at point B of FIG. 1, although the width of the output pulses may change slowly without adverse effects upon the transducer output signal. The Zener diodes 29 and 30 provide clipping points, i.e., they establish the voltages V1 and V2 as shown in FIG. 2C which are amplitudes of the pulses 32. The voltages V1 and V2 established by the reference Zener diodes 29 and 30 are set below the power voltages to the operational amplifier so that surges or excursions in the supply voltage and temperature change will not affect the amplitude of the pulses of the pulse train. V1 does not have to equal V2, but the two may be equal.

In the presence of negative voltage at point B, the duty cycle modulated oscillator 20 will produce wider pulses, although the amplitude of those pulses will remain unchanged. The frequency may change somewhat, but is not critical. The duty cycle change, i.e., change in ratio of on/off, is proportional to input voltage at point B, where one does not care about quiescent asymmetry. More specifically, the space between pulses will be decreased as illustrated by the pulses 33a, 33b, 33c and 33d of FIG. 2D. If the input at point B of FIG. 1 is positive, then the pulses will become more narrow again without a change in the amplitude of the pulses. In other words, the pulses will occur as illustrated by the pulses 33e and 33f of FIG. 2D. Stated in another way, the zero crossing points of the leading edges of the pulses 32 may be considered a quiescent signal edge. That quiescent signal edge is modulated either forward to make the pulse wider upon a negative input or is modulated rearward to make the pulse more narrow upon a positive input. It is important to note that the output is averaged over time so that changes in frequency or changes in the width of the output pulses at quiescent zero voltage input do not have any effect on the averaged output. The changed frequency or changed nominal pulse width will equally affect the positive and negative excursions of the waveform and will consequently be canceled out and have no effect on the averaged output.

The output of the duty cycle modulated oscillator is taken at point C which is connected through resistor 46a to the base of the transistor 70. The transistor 70 acts as an electronic switch or chopper. The collector of the transistor 70 is connected to ground and its emitter is connected to the point E and through the resistor 47 to the point A. Point A provides the second a.c. input to the multiplier of the present invention. As illustrated in FIG. 1, the voltage input is connected to a nominally 90° phase shift network 48 so that the wattmeter measures the average reactive power (vars). A phase correction is also made by this network to account for the phase characteristic of the modulator and any other phase errors in the circuitry. The phase shift may be adjusted by movement of adjustable resistor 48a. In this case, that is, in the measurement of vars, the waveform at the primary of transformer 40 is multiplied by the waveform at the input points 49 and 50 times the sine of the angle between them. As illustrated, the 90° phase shift network 48 includes two capacitors, three fixed resistors and a variable resistor and is connected to the primary of the voltage transformer 51. The secondary of voltage transformer 51 has resistor 12 across its output lines and is connected at its high side to point A.

The output of the transistor electronic switch 70 at point E is the combination of the input wave received from point A as modulated or chopped by the transistor switch 70. This chopped waveform at point E is illustrated in FIG. 2E. As shown, the pulses 34 of that pulse train have the width of their pulses determined by the zero crossings of the pulses 33 which are the output pulses of the duty cycle modulated oscillator 20. The amplitude of the pulses 34 is determined by the waveform 311, FIG. 2BB, which, in this case, is a voltage waveform received at point A. The input current waveform is shown in FIG. 2A and corresponding voltage waveform at point B in FIG. 2AA.

Point E is connected to a filter network 55 which removes an a.c. ripple from the output. The filter network includes resistors 56 and 57 and capacitors 58 and 100. The output of the filter taken at point F is the multiplication of the two input waveforms times the sine of the phase angle between them for equal frequency inputs. That direct current output is fed through line 62 to the positive input of an operational amplifier 59. The negative input to the amplifier is from an adjustable resistor calibration circuit 60 which sets a zero level and an adjustable resistor calibration circuit 61. The output of amplifier 59 is taken at terminals 62 and 63 and is an amplified direct current signal which may be used to operate external meters or recorders, etc.

The transducer of FIG. 1 is a var transducer providing a d.c. output which is positive for lagging power factors and negative for leading power factors. The d.c. output in that embodiment is representative of single phase reactive power which is: rms volts × rms amps × sin $\theta$, where $\theta$ is the phase angle between voltage and current. When the 90° phase shift network 48 is omitted and a phase correcting circuit added, the watt transducer provides a d.c. output which is positive for forward power and negative for reverse power and which is: rms volts × rms amps × cos $\theta$, where $\theta$ is the phase angle between voltage and current.

The circuitry of the present invention has been especially designed to provide high accuracy over a wide range of voltage, current and power factor variation, and to avoid inaccuracy in measurements due to ambient operating temperature changes and the effects of aging. In addition, the circuit offers a high degree of immunity from power line surges (surge withstand capability). Instruments constructed according to the present invention have been tested over the range −20° to +65°C and had a variance of less than ±0.1 percent over than range. These units indicated long-term stability and a high accuracy, specifically a change of less than ±0.1 percent for variations in current, voltage and power factor. These special provisions include:

1. the reference Zener diodes 29,30 which provide a clipping voltage within the supply voltage, so that excursions of the supply voltage or temperature variation will not have adverse effects;

2. that the instrument is not dependent upon the frequency of the duty cycle modulated oscillator so that slow changes in frequency, with aging, will not have an adverse effect. Even if there should be an input offset of the operational amplifier 19, or an offset drift with time and temperature of the operational amplifier 19, the accuracy of the instrument would not be adversely affected. However, the modulated AC gain should be kept constant and for that purpose the two reference Zener diodes 29,30 and resistors 22,23,24,17 and 43 should be carefully selected to be of the high accuracy type and resistant to temperature and time changes. Also the electronic switch, transistor 70, should be selected to be of the low offset type.

3. the instrument will monitor the phase angle $\theta$ between the waveforms so that changes in the phase angle will result in changes in the d.c. output. For example, the potential input and current input may be the inputs from respective automatic gain controlled amplifiers in order to produce constant amplitude signals having zero crossings, those zero crossings corresponding to original signals. These signals are fed to the instrument of the present invention to produce an output which is proportional to cos $\theta$ (power factor) or with 90° phase shift proportional to sin $\theta$.

4. by employing more than one of the instruments of the present invention and summing their contribution, a multiphase power measuring device may be constructed for any number of phases. For example, a three-phase four-wire system may be monitored by three wattmeters of the present invention, as is done in the present transducer art.

Modifications of the above-described embodiment may be made within the scope of the subjoined claims. Some of the examples of such modifications are listed below, and others will occur to those skilled in the relevant art. Examples of modifications are:

1. The omission from the circuit of FIG. 1 of the 90° phase angle shift, which would enable the circuit to monitor average power, which is: voltage input X current input X cos $\theta$.

2. The electronic switch, instead of being a transistor, may be of other types of electronic devices performing a chopper function, such as a FET (field effect transistor) or an optical device, and may be of the shunt, series or series-shunt configurations, etc.

3. The phase-shift network, at the output of the operational amplifier 19 and consisting of resistors 22,23,24 and capacitors 26,27,28, may be replaced by other types of phase-shift systems, constructed by active or passive components.

4. A phase-shift network, to compensate for the small leading phase shift introduced by the modulated oscillator 20, may be added to the instrument to increase its accuracy. The modulated oscillator adds a phase shift which increases as the input frequency approaches the modulated oscillator frequency. The phase shift correction may be added in various locations. Three possible locations are as follows:

(a) add a phase lag network at the current input, for example, at the primary of transformer 40; (b) add a phase lead network at the second input, for example, at point A in FIG. 1; or (c) add a capacitor in parallel with resistor 17 in FIG. 1.

The instrument of the present application has been described connected with its use as a wattmeter; however, when viewed as a waveform multiplier and transducer, various alternative applications are seen. Although the instrument of the present invention is primarily intended as an a-c multiplier (in which the product of two a-c waveforms is obtained) it may be employed as a d-c multiplier. Those parameters that would contribute to the asymmetry of the modulated oscillator, such as input offset and offset drift of the operational amplifier, would be carefully controlled, which control is within the skill of the art. As still another alternative, the multiplier of the present invention may be used to operate upon two current input signals or a current and a voltage input.

By way of example in the circuit of FIG. 1, for 0–5 amp a.c. and 0–150 volts a.c. inputs, the resistors 22,23,24 would be 3.01 K ohms, the resistor 25 of 1 K ohms, the resistor 17 of 4.99 K ohms, the resistor 43 of 4.99 K ohms, the resistor 11 of 249 K ohms, the resistor 12 of 1 K ohms, and resistor 47 of 10 K ohms.

A plurality of input waveforms may be used at the point H of FIG. 1 as shown in FIG. 3. The modulated oscillator 20B in FIG. 3 is used to sum and scale three input signals, although two or more than three may be utilized. The gain of the modulated oscillator at input $x$ is proportional to $(R2 + R3 + R4 + R5)/Rx$. Incidentally, this gain indicates that the ratio must be fixed $(R2 + R3 + R4 + R5)/Rx$, but their absolute values need not remain fixed. Consequently, the resistors may be formed as a unit, for example, by film methods, and, as long as they vary in resistance with temperature together, their ratio, and hence the a.c. gain, will be constant.

What is claimed is:

1. A transducer circuit to monitor two alternating waveforms, for example, one being of current and other voltage for use in the linear and accurate measurement of electrical power, said circuit comprising
   first means to monitor said first waveform,
   second means to monitor said second waveform,
   a modulator means connected to said first means, said modulator means being an oscillator whose frequency is nominally independent of said first waveform but whose output pulse varies in its duty cycle zero crossings in direct proportion to the amplitude of said first waveform, said modulator means including an operational amplifier having an input and an output, a phase-shift means and a negative feedback connection between said operational amplifier output and input, said negative feedback connection including said phase shift network, said modulator means having a linear and constant a.c. gain although its d.c. offset may vary,
   electronic switch means connected to and controlled as to switching by said modulator and connected to said second monitor means and having an output, said switch means being switched between the conducting and non-conducting states during each of the zero crossings by said modulator, whereby the output of said switch is a train of pulses whose amplitude is directly proportional to the amplitude of said second waveform and whose duty cycle zero crossing timing is directly proportional to the amplitude of said first waveform and whose frequency is nominally constant,
   filter means connected to the switch output to produce a direct current signal, said direct current signal being proportional to said electrical power,
   whereby said direct current signal is not dependent upon the symmetry of the modulator output and therefore may be substantially independent of adverse aging and temperature effects.

2. A transducer circuit as in claim 1 wherein said phase shift means is a resistor-capacitor phase shift network providing a phase-shift of substantially 180° at the frequency of oscillation.

3. A transducer circuit as in claim 2 and further including at least one reference voltage diode to provide a negative and a positive clip-off point, thereby making the amplitude of said modulator output substantially independent of voltage supply and temperature.

4. A transducer as in claim 1 wherein said electronic switch is a single transistor having base, emitter and collector terminals whose base terminal is connected to the output of said modulator.

5. A transducer circuit as in claim 1 and further including amplifier means, including an operational amplifier connected to said filter to amplify the d.c. output of said filter.

6. A transducer circuit as in claim 1 utilized as a wattmeter to monitor a power line and wherein said first monitoring means is a current transformer whose primary is connected to said line and said second monitoring means is a voltage transformer whose primary is connected to said power line.

7. A transducer circuit as in claim 6 and further including a power supply means, said power supply means comprising a power transformer whose primary is connected to said power line, a bridge rectifier connected to the secondary of the power transformer, and a regulator circuit including a plurality of Zener diodes connected to said rectifier.

8. A transducer as in claim 7 and further including a nominally 90° phase shift network connected between said power line and the primary of said current transformer, said phase shift network comprising a resistance-capacitor network, whereby said transducer will monitor reactive power (vars).

9. A wattmeter for measuring the electric power in an alternating current electric line comprising
   a first monitoring means for monitoring the alternating current on said power line,
   a second monitoring means for monitoring the alternating voltage on said power line,
   a duty cycle modulated oscillator connected to one of said monitoring means, said duty cycle modulated oscillator producing a train pulse of nominally constant frequency and amplitude whose duty cycle is modulated by said connected monitoring means;
   wherein the only active element in said duty cycle modulated oscillator is a single operational amplifier having a negative feedback path and said duty cycle modulated oscillator includes a phase-shift means in said feedback path;
   an electronic switch means having an input and a control terminal, said input being connected to the other of said monitoring means and said control terminal being connected to said output of said duty cycle modulated oscillator, said switch output providing a pulse train, the duty cycle of the pulses being determined by operation of the switch control terminal by the duty cycle of said pulse train from said duty cycle modulated oscillator and the amplitude being determined by the amplitude detected by said other monitoring means, and
   filter means connected to said switch means to filter said pulse train from said switch means to produce a direct current potential representative of said electric power.

10. A wattmeter as in claim 9 wherein said wattmeter further comprises an amplifier having an input and an output whose input is connected to the filter and whose output is the output of the wattmeter.

11. A wattmeter as in claim 10 wherein said amplifier is an operational amplifier.

12. A wattmeter as in claim 1 wherein said first monitoring means is a current transformer and said second monitoring means is a voltage transformer.

13. A wattmeter as in claim 9 and further including a power supply means, said power supply means comprising a power transformer whose primary is connected to said power line, a bridge rectifier connected to the secondary of the power transformer, and a regulator circuit including a plurality of Zener diodes connected to said rectifier.

* * * * *